US012810918B2

(12) United States Patent
Ishii et al.

(10) Patent No.: US 12,810,918 B2
(45) Date of Patent: Nov. 24, 2026

(54) MEMORY DEVICE AND METHOD FOR MAINTAINING TIME MARGIN BETWEEN CONSECUTIVE MEMORY ACCESS OPERATIONS

(71) Applicant: TAIWAN SEMICONDUCTOR MANUFACTURING COMPANY LTD., Hsinchu (TW)

(72) Inventors: Yuichiro Ishii, Kanagawa (JP); Tomotaka Tanaka, Hsinchu (TW); Yumito Aoyagi, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 178 days.

(21) Appl. No.: 18/801,878

(22) Filed: Aug. 13, 2024

(65) Prior Publication Data

US 2025/0342877 A1 Nov. 6, 2025

Related U.S. Application Data

(60) Provisional application No. 63/642,892, filed on May 6, 2024.

(51) Int. Cl.

| | |
|---|---|
| ***G11C 11/4076*** | (2006.01) |
| ***G11C 11/406*** | (2006.01) |
| ***G11C 11/408*** | (2006.01) |
| ***G11C 11/4094*** | (2006.01) |
| ***G11C 11/418*** | (2006.01) |
| ***G11C 11/419*** | (2006.01) |

(52) U.S. Cl.
CPC .... *G11C 11/4076* (2013.01); *G11C 11/40615* (2013.01); *G11C 11/4085* (2013.01); *G11C 11/4094* (2013.01); *G11C 11/418* (2013.01); *G11C 11/419* (2013.01); *G11C 2211/4066* (2013.01)

(58) Field of Classification Search
CPC .......... G11C 11/4076; G11C 11/40615; G11C 11/4085; G11C 11/4094; G11C 2211/4066; G11C 11/418; G11C 11/419
See application file for complete search history.

(56) References Cited

U.S. PATENT DOCUMENTS

| | | | | |
|---|---|---|---|---|
| 10,026,472 B2 | 7/2018 | Ishii | | |
| 2014/0185366 A1* | 7/2014 | Chandwani | G11C 7/08 | 365/154 |
| 2018/0122458 A1* | 5/2018 | Ishii | G11C 11/419 | |

* cited by examiner

*Primary Examiner* — Alexander Sofocleous
*Assistant Examiner* — Joseph Fidelis Stormes
(74) *Attorney, Agent, or Firm* — WPAT LAW; Anthony King

(57) ABSTRACT

The present disclosure provides a memory device, which includes a first memory array, and a memory control circuit. The memory control circuit performs a first memory access operation in response to a first clock pulse of a control internal clock signal. The memory control circuit generates a first reset signal and asserts a first bit-line precharge signal in response to completion of the first memory access operation, and generates a second reset signal using the first reset signal and a second bit-line precharge signal obtained from the first bit-line precharge signal. The memory control circuit generates a second clock pulse of the control internal clock in response to the second reset signal, and performs a second memory access operation associated with the second memory access command at the second clock pulse.

20 Claims, 16 Drawing Sheets

100B

MEMORY DEVICE AND METHOD FOR MAINTAINING TIME MARGIN BETWEEN CONSECUTIVE MEMORY ACCESS OPERATIONS

CROSS-REFERENCE TO RELATED APPLICATIONS

This application claims the benefit of U.S. Provisional Application No. 63/642,892, filed May 6, 2024, the entire disclosure of which is incorporated by reference herein.

BACKGROUND

Pseudo two-port static random access memory (SRAM) is a technology that achieves the functionality of a pseudo two-port SRAM by utilizing a memory macro of a single-port SRAM. This technology is commonly utilized in the field of image processing. The internal circuit of the pseudo two-port SRAM is designed to execute two operations within a single cycle of an external clock.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features can be arbitrarily increased or reduced for clarity of discussion.

DETAILED DESCRIPTION

Figure 1A:
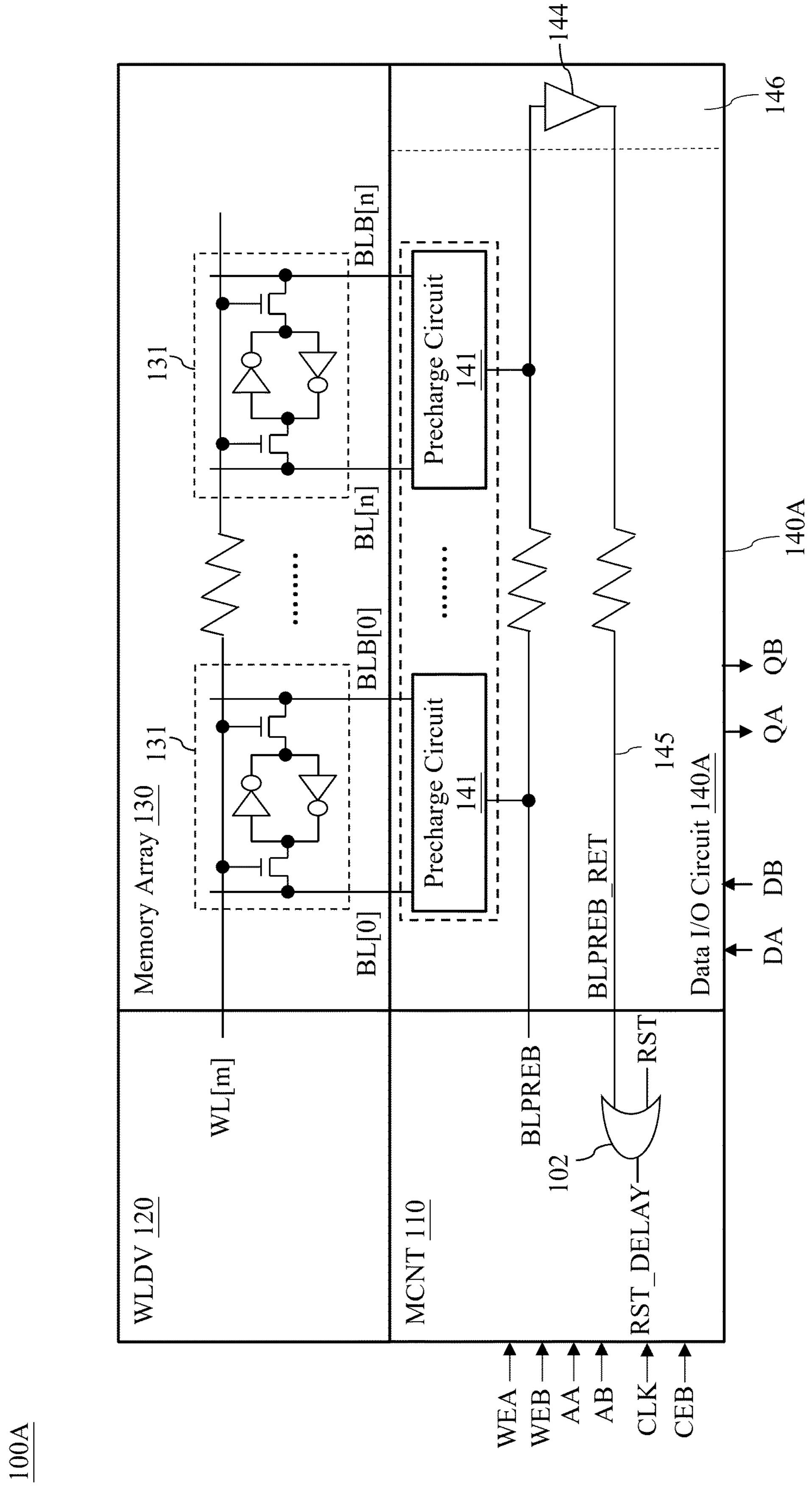
FIG. 1A is a block diagram of a memory device in accordance with an embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being “connected to” or “coupled to” another element, it can be directly connected to or coupled to the other element, or intervening elements can be present.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device can be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

Figure 1B:
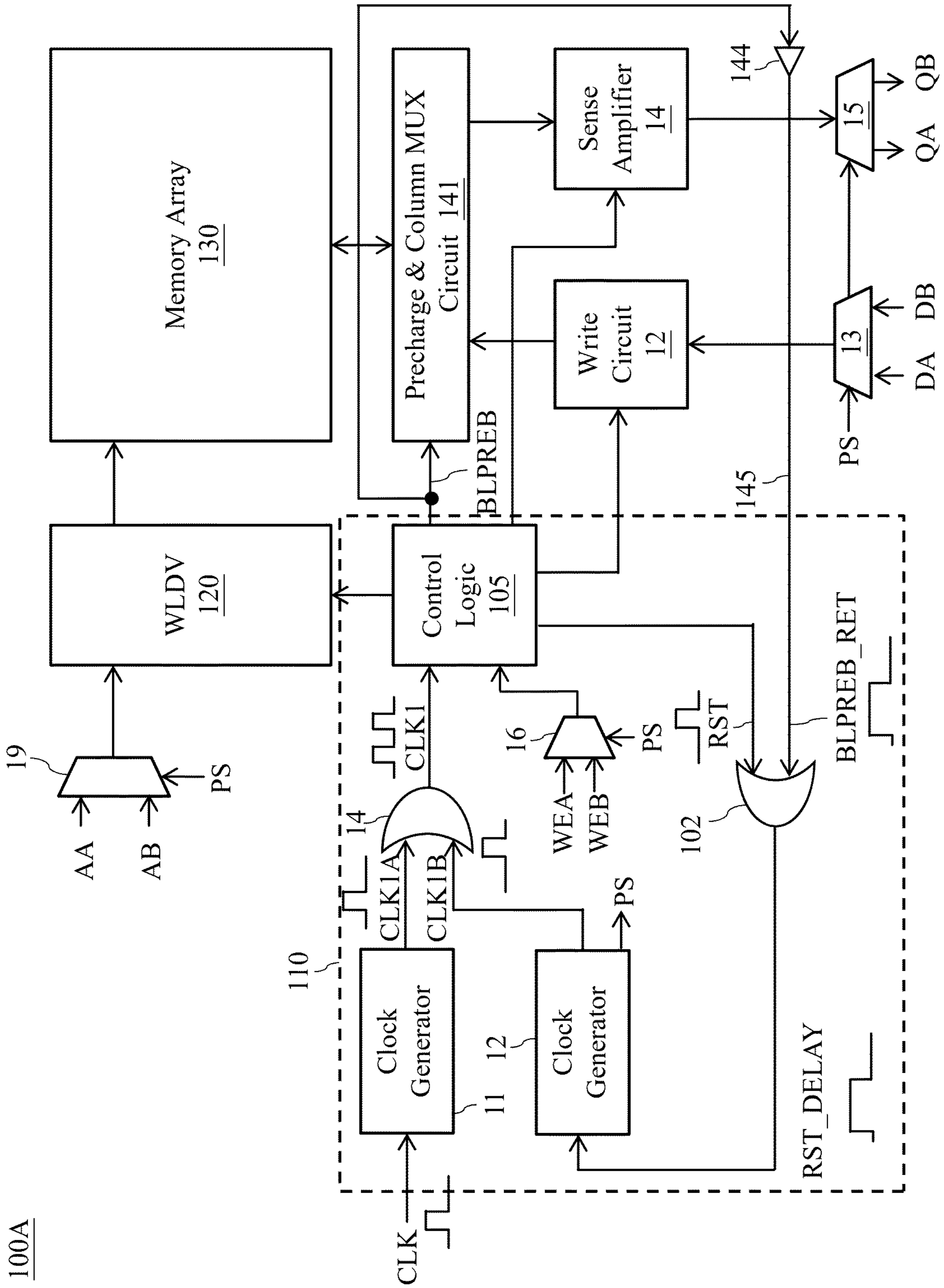
FIG. 1B is a circuit block diagram of the memory device 100 in FIG. 1A.
Figure 1C:
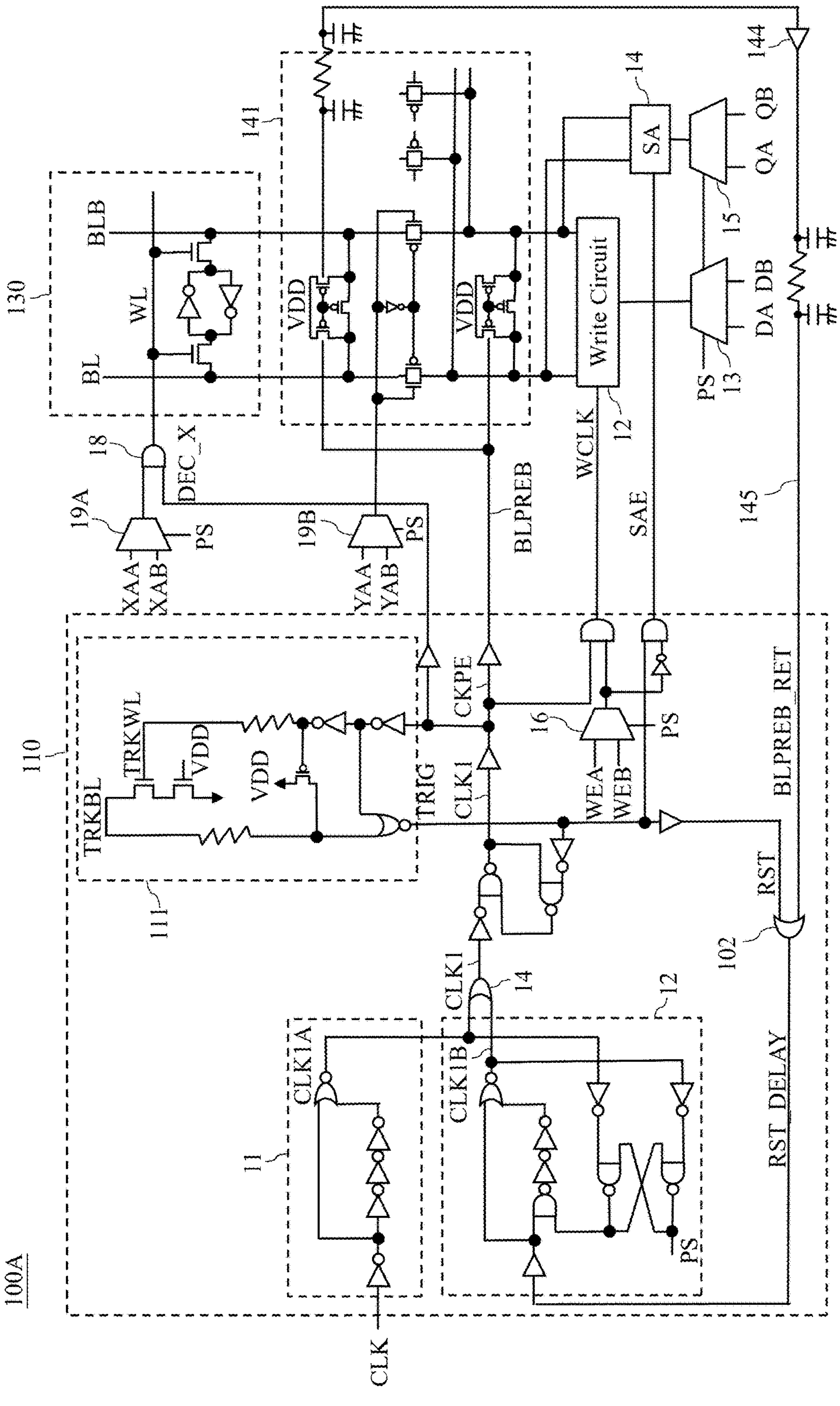
FIG. 1C is a schematic diagram of the memory device 100 in FIG. 1A.

FIG. 1A is a block diagram of a memory device in accordance with an embodiment of the disclosure. FIG. 1B is a circuit block diagram of the memory device 100 in FIG. 1A. FIG. 1C is a schematic diagram of the memory device 100 in FIG. 1A.

In some embodiments, the memory device 100 may be a pseudo two-port static random access memory (SRAM) or a pseudo double-pump SRAM. The memory device 100 may be implemented as a standalone memory chip, or be integrated into an integrated circuit or a system-on-chip (SoC). As shown in FIG. 1, the memory device 100 may include a memory control circuit (abbreviated as MCNT) 110, a word line driver (abbreviated as WLDV) 120, a memory array 130, and a data input/output (I/O) circuit 140. The memory control circuit 110 may be configured to receive an input memory command, and decode the input memory command to generate a decoded row address signal (e.g., XAA and XAB) and a decoded column address signal (e.g., YAA and YAB). In some embodiments, the input memory command may include address signals AA and AB, a chip enable signal CEB, and write enable signals WEA and WEB. The chip enable signal CEB and the write enable signals WEA and WEB may be low active signals. In some other embodiments, two different input memory commands carrying signals associated with Port-A and Port-B of the memory device 100 are used for two memory access operations performed at two consecutive pumps of the internal clock CLK1/CKPE of the memory device 100.

In some embodiments, the word line driving circuit 120 may be configured to assert one of the word lines of the memory array 130 in response to the decoded row address signal, which can be the address signal AA or AB, thereby activating one word line of the memory array 130.

In some embodiments, the memory array 130 may include a plurality of memory cells 131 arranged in a two-dimensional array. The memory cells 131 within the memory array 130 are controlled by a plurality of word lines WL (e.g., WL[0] to WL[m]) and bit lines BL/BLB (e.g., BL[0]/BLB[0] to BL[n]/BLB[n]). In some embodiments, the data I/O circuit 140A may include a plurality of I/O pads (not shown) that correspond to the precharge circuits 141. The precharge circuits 141 may correspond to the memory cells 131 on the bit line pairs BL[0]/BLB[0] to BL[n]/BLB[n], and the memory cells 131 on the selected word line WL are activated, and the precharge circuits 141 is configured to precharge the voltage level of the selected bit line BL/BLB corresponding to the activated memory cells 131 to a predetermined voltage level before performing a write operation or a read operation to the activated memory cell 131, such as VDD/2, where VDD is a power supply voltage. It should be noted that the memory cell 131 on the selected word line WL and the selected bit line BL/BLB can pass its data to the data I/O circuit 140A, or receive data to be written to the selected memory cell 131 from the data I/O circuit 140A.

In some embodiments, when the chip enable signal CEB is in the high logic state (e.g., "1"), the memory device 100 is disabled. When the chip enable signal CEB is in the low logic state (e.g., "0"), the memory device 100 is activated, and the memory control circuit 110 may receive the other input signals to perform a read operation or a write operation. Additionally, the address signal AA is used during the first clock cycle of the internal clock (e.g., CKPE) generated by the memory control circuit 110 based on the input clock signal CLK, while the address signal AB is used during the second clock cycle of the internal clock. The overall duration of the first clock cycle and the second clock cycle of the internal clock is within one clock cycle of the input clock signal CLK provided to the memory device 100. Similarly, if the memory access operation is a write operation during the first clock cycle of the internal clock, the write enable signal WEA is in the low logic state. Otherwise, the write enable signal WEA is in the high logic state. Likewise, if the memory access operation is a write operation during the second clock cycle of the internal clock, the write enable signal WEB is in the low logic state. Otherwise, the write enable signal WEB is in the high logic state. Moreover, multiplexer 19 switches its output address signal from address signal AA to address signal AB based on a switch control signal PS (shown in FIG. 1B) generated by the memory control circuit 110, while multiplexer 16 will switch its output write enable signal from the write enable signal WEA to the write enable signal WEB based on the switch control signal PS.

It should be noted that FIG. 1A also illustrates a layout diagram of the memory device 100. It indicates that the layout blocks of the memory control circuit 110, word line driving circuit 120, memory array 130, and the data I/O circuit 140A may have the layout arrangement shown in FIG. 1. In some embodiments, the memory control circuit 110 may generate a bit-line precharge signal BLPREB, which is a low active signal, and transmit the bit-line precharge signal BLPREB to the precharge circuits 141. Additionally, the memory control circuit 110 may generate a delayed reset signal RST_DELAY based on a reset signal RST and a delayed bit-line precharge signal BLPREB_RET. For example, the reset signal RST and the delayed bit-line precharge signal BLPREB_RET are provided to the OR gate 102 to generate the delayed reset signal RST_DELAY. It should be noted that the dimension of the data I/O circuit 140A may increase as the size of the memory array 130 increases.

In some embodiments, the conductive wire 145 of the bit-line precharge signal BLPREB may start from the memory control circuit 110 to an edge portion 146 of the data I/O circuit 140A, and goes back from the edge portion 146 to the memory control circuit 110 through buffer 144. Additionally, the conductive wire 145 of the bit-line precharge signal BLPREB is electrically connected to the precharge circuits 141, and the overall capacitance of the conductive wire 145 is considerable. Accordingly, the conductive wire 145 has a large RC (resistance-capacitance) loading to create a longer delay to the bit-line precharge signal BLPREB, as the delayed bit-line precharge signal BLPREB_RET is received by the OR gate 102. In other words, the delayed bit-line precharge signal BLPREB_RET received by the OR gate 102 has a large delay compared to the bit-line precharge signal BLPREB generated by the control logic 105 of the memory control circuit 110, allowing the OR gate 102 to generate the delayed reset signal RST_DELAY with a large delay. It should be noted that the conductive wire 145 is not at the same metal layer as I/O pads (not shown) within the data I/O circuit 140A, and the conductive wire 145 may be implemented by an individual metal layer different from the metal layer on which the I/O pads are formed at the back-end-of-line (BEOL) section for fabricating the memory device 100. In some embodiments, the segment of the conductive wire 145 associated with the bit-line precharge signal BLPREB from the memory control circuit 110 to the edge portion 146 is parallel to the word lines WL within the memory array 130 and another segment of the conductive wire 145 associated with the delayed bit-line precharge signal BLPREB_RET from the edge portion 146 to the memory control circuit 110.

It should be noted that when the voltage level of the tracking word line TRKBL shown in FIG. 1C decreases to a certain voltage level, the trigger signal TRIG is switched from the low logic state to the high logic state, indicating that the current read or write operation is completed. The reset signal RST (e.g., a first reset signal) is a delayed version of the trigger signal TRIG, as shown in FIG. 1C. The OR gate 102 may perform an OR operation on the reset signal RST and the delayed bit-line precharge signal BLPREB_RET to generate the delayed reset signal RST_DELAY (e.g., a second reset signal). Accordingly, the switch control signal PS generated by the clock generator 12 can be delayed by the delayed reset signal RST_DELAY, such that the second memory operation during the second clock cycle of the internal clock CKPE can start at a later time, but the overall duration of the first clock cycle (e.g., first pump) and the second clock cycle (e.g., second pump) of the internal clock CKPE is still within one clock cycle of the input clock signal CLK. Therefore, in response to completion of the first memory access operation, the time margin between the first memory access operation and the second memory access operation within two clock cycles of the internal clock CKPE can be ensured to allow the precharge circuits 141 to precharge the voltages of the bit line pairs BL/BLB to the predetermined voltage level (e.g., VDD/2) before the second memory access operation is performed. The detailed operations of the memory device 100 are described with reference to FIG. 2 as follows.

Figure 2:
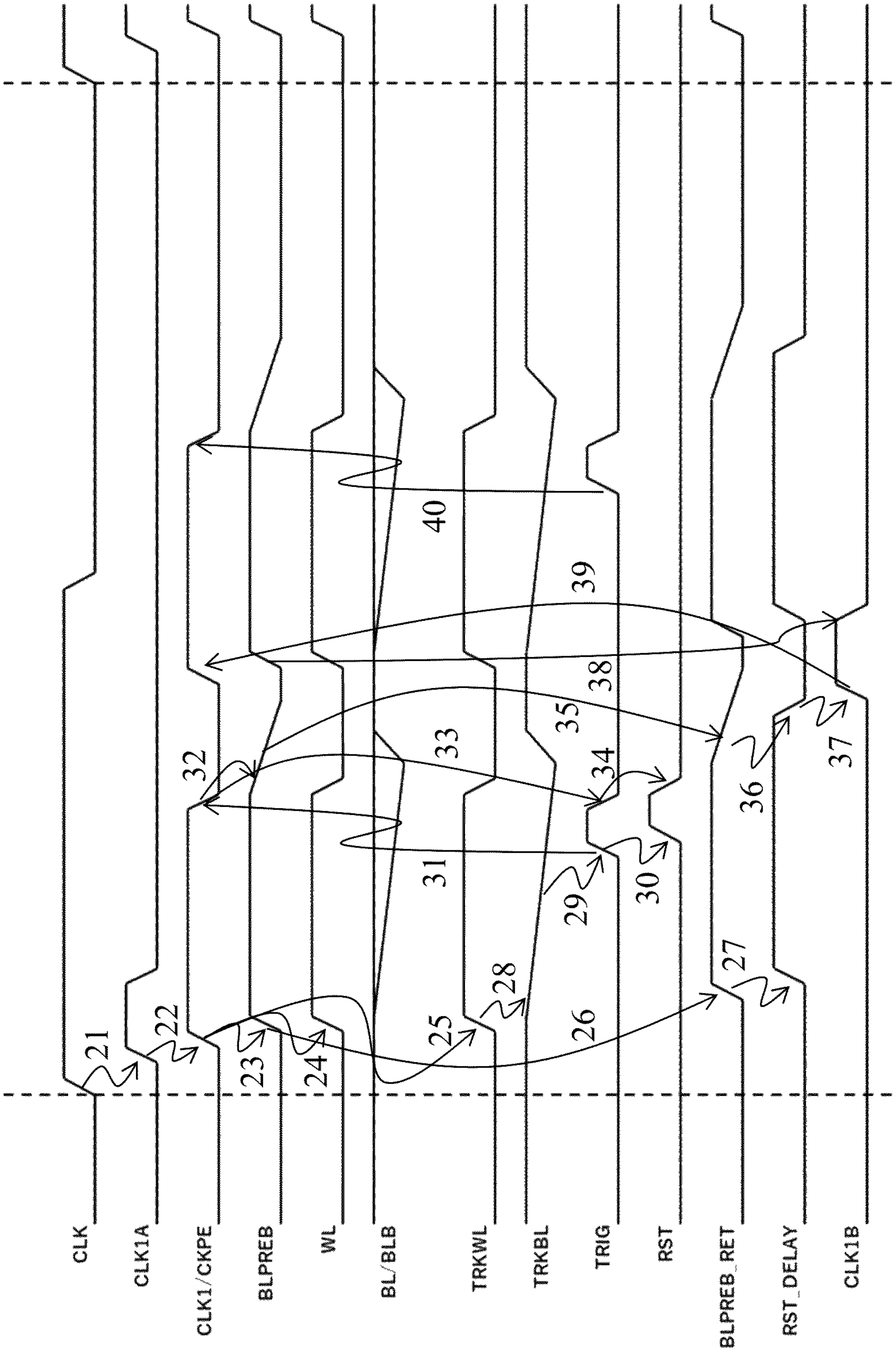
FIG. 2 is a waveform diagram illustrating various signals within the memory device in accordance with the embodiment of FIG. 1C.

FIG. 2 is a waveform diagram illustrating various signals within the memory device in accordance with the embodiment of FIG. 1C.

In some embodiments, when the memory device 100 receives the input clock signal CLK (e.g., an external clock signal), the clock generator 11 may generate a first clock pulse of an internal clock signal CLK1A, as shown by arrow 21. The first clock pulse of the internal clock signal CLK1A propagates to control logic 105 as an internal clock CLK1 through OR gate 14, as shown by arrow 22. Upon the control logic 105 detecting the rising edge of the first clock pulse of the internal clock CLK1, the memory device 100 starts to perform a first memory access operation, such as a read operation or a write operation, for Port-A. For example, the multiplexers 19A and 19B shown in FIG. 1C select the decoded row address XAA and the decoded column address YAA as the active row address and column address, respectively, for accessing one of the memory cells 131 within the memory array 130. The decoded row addresses XAA/XAB and the decoded column addresses YAA/YAB are generated by an address decoder (not shown) within the memory control circuit 110 based on the received address signals AA and AB. It should be noted that the multiplexers 19A, 19B, and 16 select the decoded row address signal XAA, the decoded column address signal YAA, and the write enable signal WEA for the first memory access operation associated with Port-A.

In some embodiments, upon the control logic 105 detecting the rising edge of the internal clock CLK1 or CKPE, the control logic 105 may de-assert the bit-line precharge signal BLPREB and assert the tracking word line TRKWL, and the word line driving circuit 120 may activate one word line WL based on the decoded row address XAA, as shown by arrows 23, 24, and 25, respectively. The bit-line precharge signal BLPREB is delayed by the conductive wire 145 and buffer 144 to obtain the delayed bit-line precharge signal BLPREB_RET, as shown by arrow 26. Upon the tracking circuit 111 detecting the rising edge of the tracking word line TRKWL, the voltage level of the tracking bit line TRKBL gradually decreases, as shown by arrow 28.

In some embodiments, the delayed reset signal RST_DELAY is generated by the OR gate 102 with one OR-gate delay after the delayed bit-line precharge signal BLPREB_RET, as shown by arrow 27. Upon the voltage level of the tracking word line TRKBL shown in FIG. 1C decreases to a certain voltage level (e.g., logic 0), the trigger signal TRIG is switched from the low logic state to the high logic state, as shown by arrow 29, indicating that the first memory access operation is completed. The trigger signal TRIG is delayed by a buffer to generate the reset signal RST, as shown by arrow 30. Upon the control logic 105 detecting the rising edge of the trigger signal TRIG, the control logic 105 de-asserts the internal clock signal CLK1/CKPE, as shown by arrow 31. Additionally, upon the control logic 105 detecting the falling edge of the internal clock signal CLK1/CKPE, the control logic 105 asserts the bit-line precharge signal BLPREB (e.g., decreases the voltage of BLPREB) and de-asserts the trigger signal TRIG, as shown by arrows 32 and 33, respectively. It should be noted that the slew rate of the delayed bit-line precharge signal BLPREB_RET is small due to large RC loading of the conductive wire 145, such that the voltage of the bit-line precharge signal BLPREB decreases gradually. Following the trigger signal TRIG, the reset signal RST is also de-asserted, as shown by arrow 34.

It should be noted that the delayed bit-line precharge signal BLPREB_RET follows the bit-line precharge signal BLPREB with the delay caused by the conductive wire 145 and buffer 144, as shown by arrow 35. When the voltage of the delayed bit-line precharge signal BLPREB_RET is decreased to a certain level of the low logic state (e.g., logic 0), the delayed reset signal RST_DELAY generated by the OR gate 102 switches from the high logic state to the low logic state, as shown by arrow 36.

In some embodiments, the clock generator 12 generates the switch control signal PS based on the delay reset signal RST_DELAY, as shown in FIG. 1C. Specifically, when the clock generator 12 detects the falling edge of the delayed reset signal RST_DELAY, the clock generator 12 generates a clock pulse of an internal clock signal CLK1B, as shown by arrow 37. At this time, the clock generator 12 also switches the switch control signal PS from the low logic state (e.g., "0") to the high logic state ("1"), allowing the multiplexers 19A, 19B, and 16 to select the decoded row address signal XAB, the decoded column address signal YAB, and the write enable signal WEB for the second memory access operation associated with Port-B. Additionally, the multiplexers 13 and 15 also selects the input data signal DB and output data signal QB, respectively. It should be noted that the clock pulse of the internal clock signal CLK1B is maintained at the high logic state until the bit-line precharge signal BLPREB is pulled down to the ground voltage (e.g., OV) at the edge portion 146 and the bit line pairs BL/BLB are fully pre-charged (i.e., detecting the rising edge of BLPREB) to the predetermined voltage level (e.g., VDD/2), as shown by arrow 38. Furthermore, the internal clock signal CLK1 is generated by OR gate 14 using the internal clock signals CLK1A and CLK1B from the clock generators 11 and 12. When the clock pulse of the internal clock signal CLK1B is generated, the internal clock signal CLK1 generated by OR gate 14 follows the clock pulse of the internal clock signal CLK1B with one OR-gate delay, as shown by arrow 39. Additionally, the second clock pulse of the internal clock signal CLK1/CKPE is pulled down to the ground voltage when the control logic 105 detects another rising edge of the trigger signal TRIG, as shown by arrow 40.

Figure 3A:
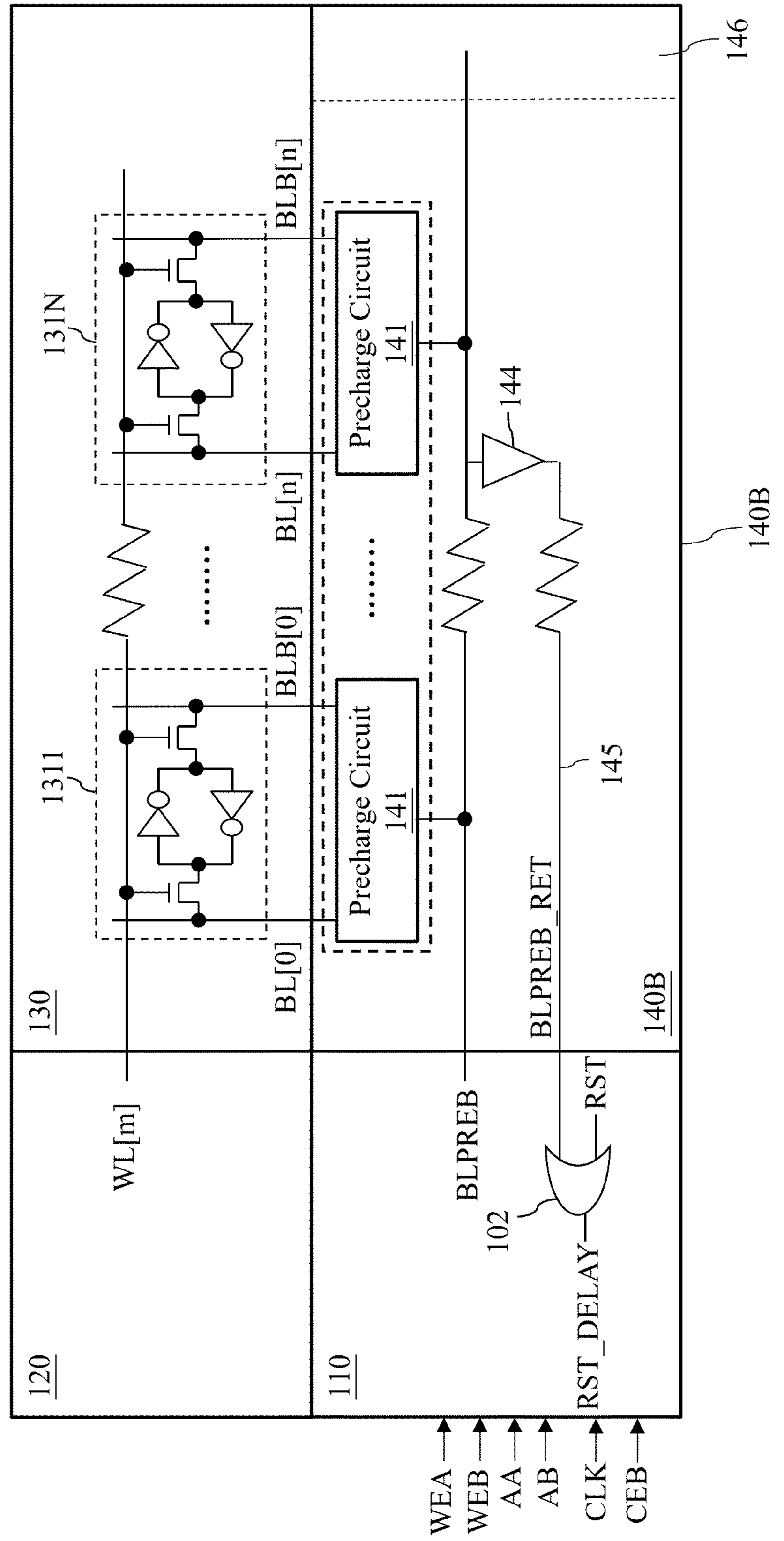
FIGS. 3A-3C are block diagrams of memory devices in accordance with different embodiments of the present disclosure.
Figure 3B:
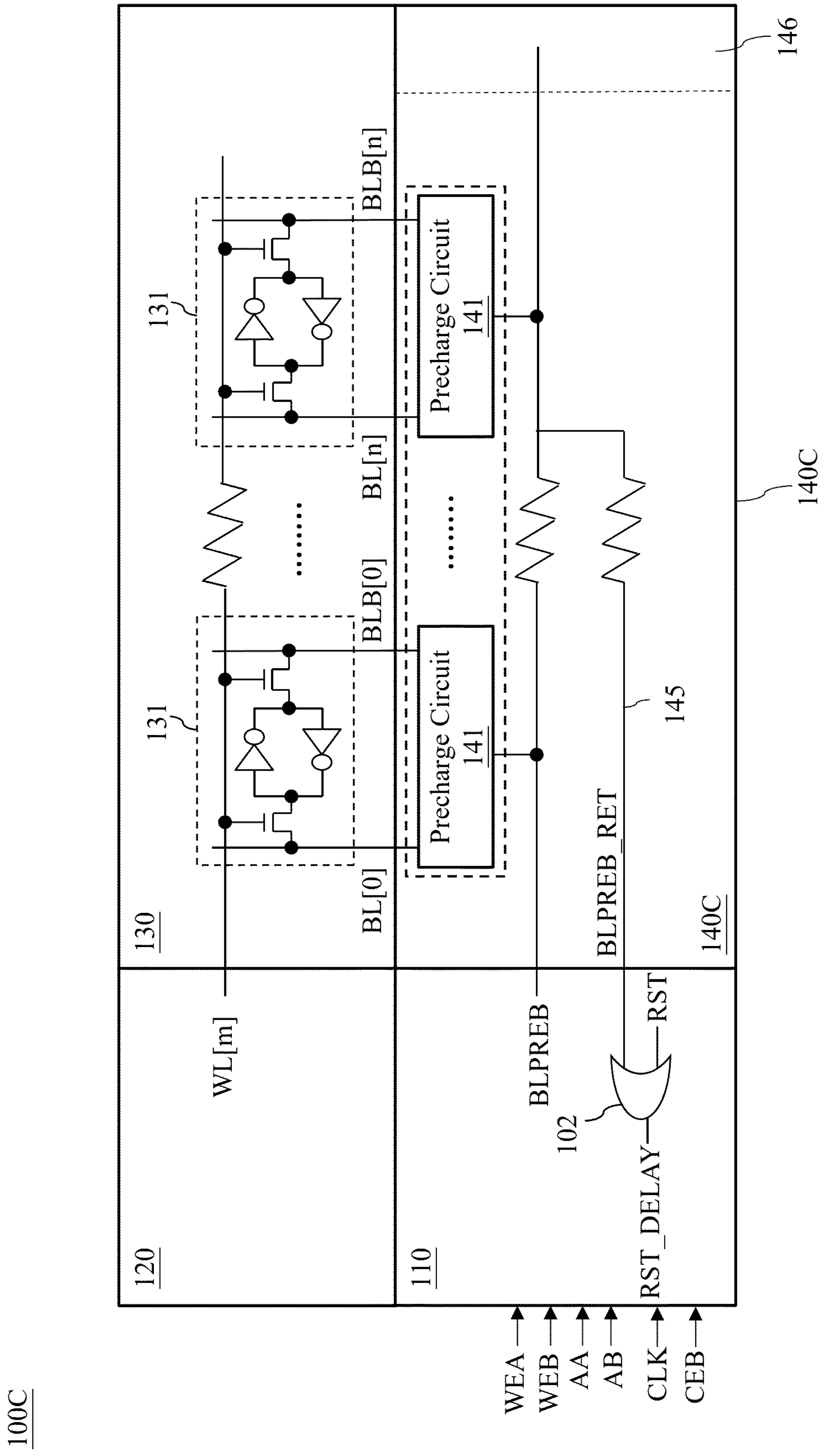
Figure 3C:
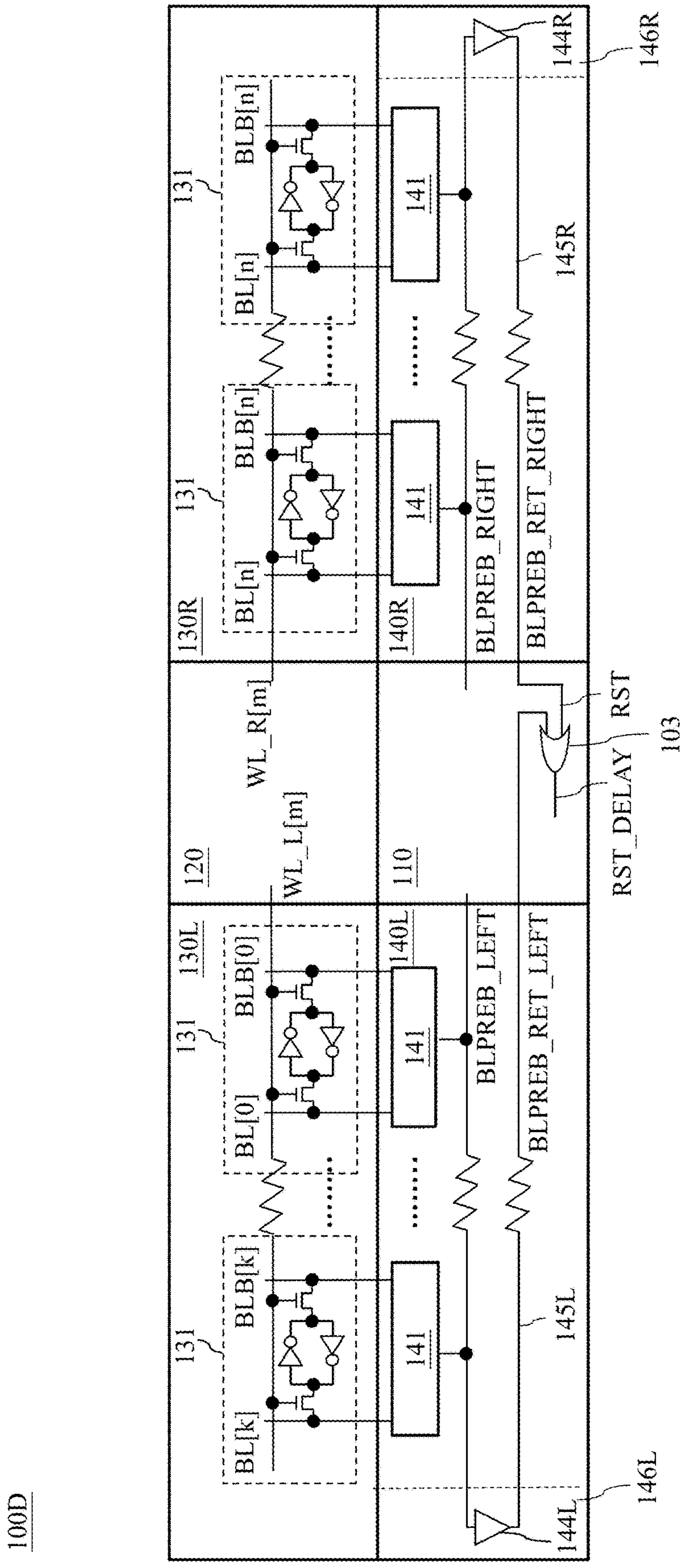

FIGS. 3A-3C illustrates block diagrams of memory devices 100B, 100C, and 100D, respectively, as well as layout diagrams thereof. In some embodiments, the memory device 100B shown in FIG. 3A is similar to the memory device 100A shown in FIG. 1A, with the difference being that the routing path of the conductive wire 145 is returned at the middle portion of the data I/O circuit 140B through buffer 144 rather than at the edge portion 146 in the memory device 100B. It should be noted that the returning location of the conductive wire 145 can be at any location within the data I/O circuit 140B, depending on the RC loading required to create an appropriate delay for the delayed bit-line precharge signal BLPREB_RET to ensure the time margin between completion of the first memory access operation and the execution of the second memory access operation.

Referring to FIG. 3B, the memory device 100C shown in FIG. 3B is similar to the memory device 100B in FIG. 3A, with the difference being that buffer 144 is omitted from the memory device 100C. Specifically, buffer 144 is replaced by yet another segment of the conductive wire 145 at the returning position. It should be noted that buffer 144 shown in FIG. 3A may be designed to add some delay to the delayed bit-line precharge signal BLPREB_RET, and thus can be omitted with the RC loading of the conductive wire 145 being large enough to create an appropriate delay to the delayed bit-line precharge signal BLPREB_RET.

Referring to FIG. 3C, a 2-wing layout diagram of the memory device 100D is illustrated. In some embodiments, the memory control circuit 110 and the word line driving circuit 120 are arranged at the central region of the layout of the memory device 100D, and 2 wings are disposed at opposite sides of the central region. For example, the memory arrays 130R and 130L may be disposed at opposite sides of the word line driving circuit 120, and the word line driving circuit 120 may assert one of the word lines WL_R and WL_L according to the decoded row address XAA or XAB, and the memory cells 131. Similarly, the data I/O circuits 140R and 140L are disposed at opposite sides of the memory control circuit 110, and the memory control circuit 110 may assert the bit-line precharge signal BLPRE-B_RIGHT or BLPREB_LEFT for the data I/O circuit 140R or 140L based on the activated memory array 130R or 130L. It should be noted that the OR gate 103 shown in FIG. 3C is a 3-input OR gate which receives the signals BLPRE-B_RET_RIGHT, BLPREB_RET_LEFT, and RST to generate the delayed reset signal RST_DELAY. Since the bit-line precharge signals BLPREB_RIGHT and BLPREB_LEFT are low active, their respective delayed bit-line precharge signals BLPREB_RET_RIGHT and BLPREB_RET_LEFT are also low active. Thus, when the left wing or right wing is not activated, their respective delayed bit-line precharge signal BLPREB_RET_RIGHT or BLPREB_RET_LEFT is kept at the low logic state (e.g., "0"), which will not change the logic state of the delayed reset signal RST_DELAY generated by the OR gate 103.

It should be noted that the conductive wires 145R and 145L are not at the same metal layer as I/O pads (not shown) within the data I/O circuits 140R and 140L, and the conductive wires 145R and 145L may be implemented by an individual metal layer different from the metal layer on which the I/O pads are formed at the back-end-of-line (BEOL) section for fabricating the memory device 100D. In some embodiments, the segment of the conductive wires 145R and 145L associated with the bit-line precharge signals BLPREB_RIGHT and BLPREB_LEFT from the memory control circuit 110 to the edge portion 146R/146L are parallel to the word lines WL within the memory arrays 130R and 130L and the segments of the conductive wire 145R and 145L associated with the delayed bit-line precharge signals BLPREB_RET_RIGHT and BLPRE-B_RET_LEFT from the edge portion 146R/146L to the memory control circuit 110.

Figure 4A:
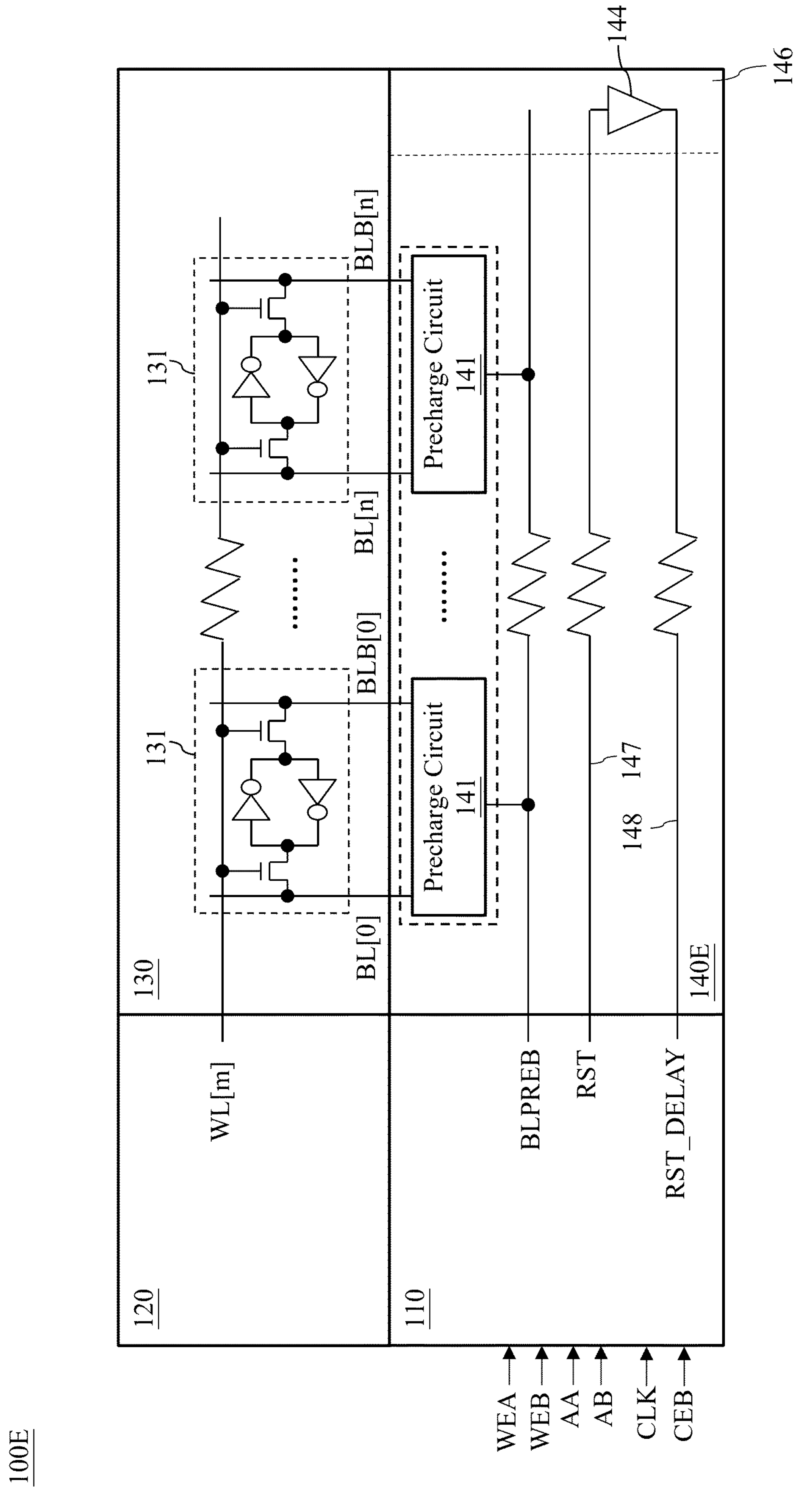
FIG. 4A is a block diagram of a memory device in accordance with an embodiment of the disclosure.
Figure 4B:
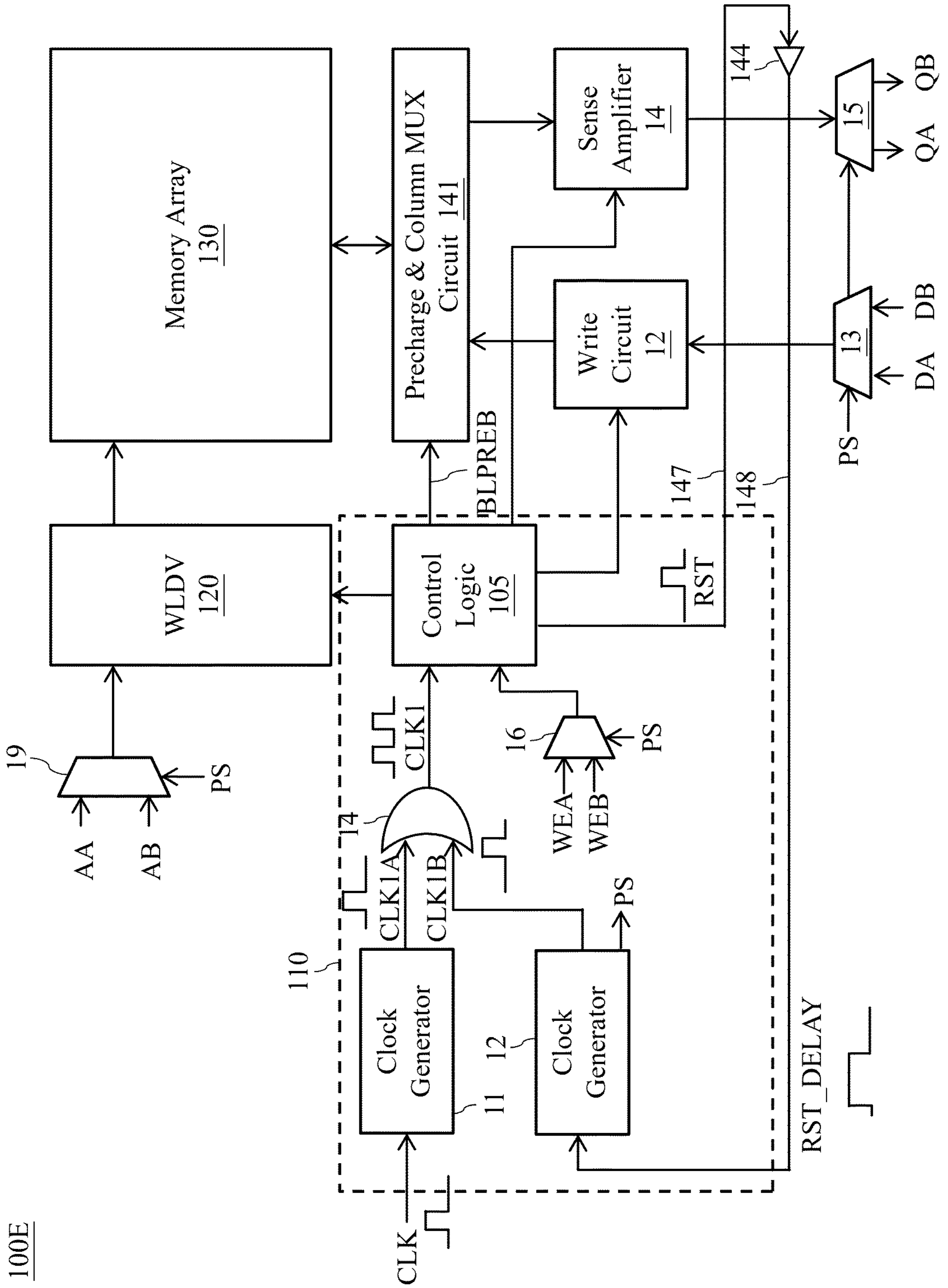
FIG. 4B is a circuit block diagram of the memory device 100 in FIG. 4A.
Figure 4C:
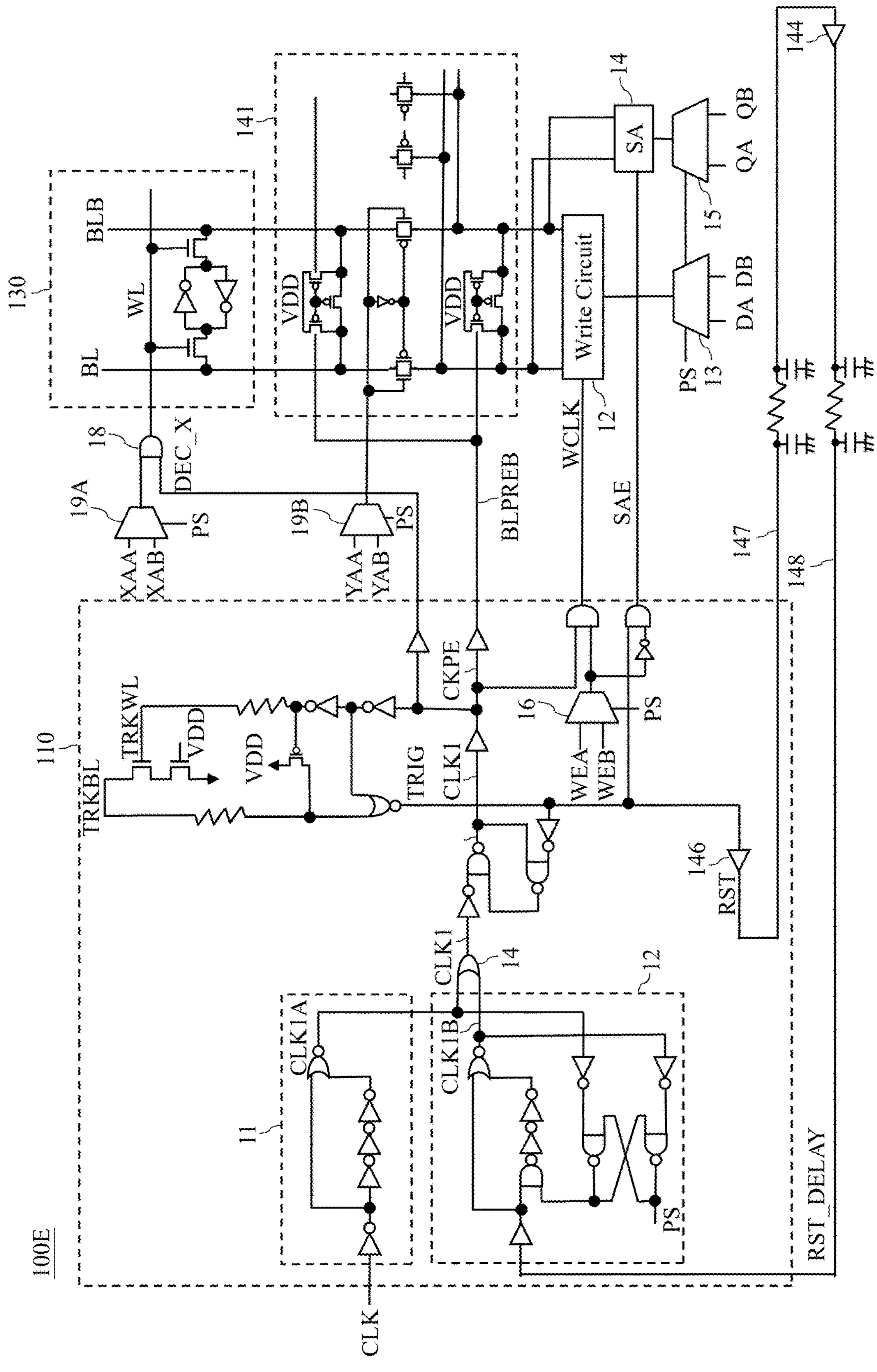
FIG. 4C is a schematic diagram of the memory device 100 in FIG. 4A.

FIG. 4A is a block diagram of a memory device in accordance with an embodiment of the disclosure. FIG. 4B is a circuit block diagram of the memory device 100 in FIG. 4A. FIG. 4C is a schematic diagram of the memory device 100 in FIG. 4A.

Referring to FIG. 4A, in some embodiments, the memory device 100E shown in FIGS. 4A-4C may be similar to the memory device 100A shown in FIGS. 1A-1C, with the difference being that the delayed reset signal RST_DELAY is generated using the reset signal RST without the bit-line precharge signal BLPREB. For example, as depicted in FIG. 4A, the reset signal RST generated by the memory control circuit 110 propagates from the memory control circuit 110 to the edge portion 146 of the data I/O circuit 140F along the conductive wire 147, and goes back from the edge portion 146 to the memory control circuit 110 along the conductive wire 148 through buffer 144. The conductive wires 147 and 148 may also have a large RC loading to provide a longer delay to the reset signal RST to obtain the delayed reset signal RST_DELAY. The operations of other components within the memory device 100E can be referred to the embodiments of FIGS. 1A-1C, and the details thereof will not be repeated here.

Figure 5:
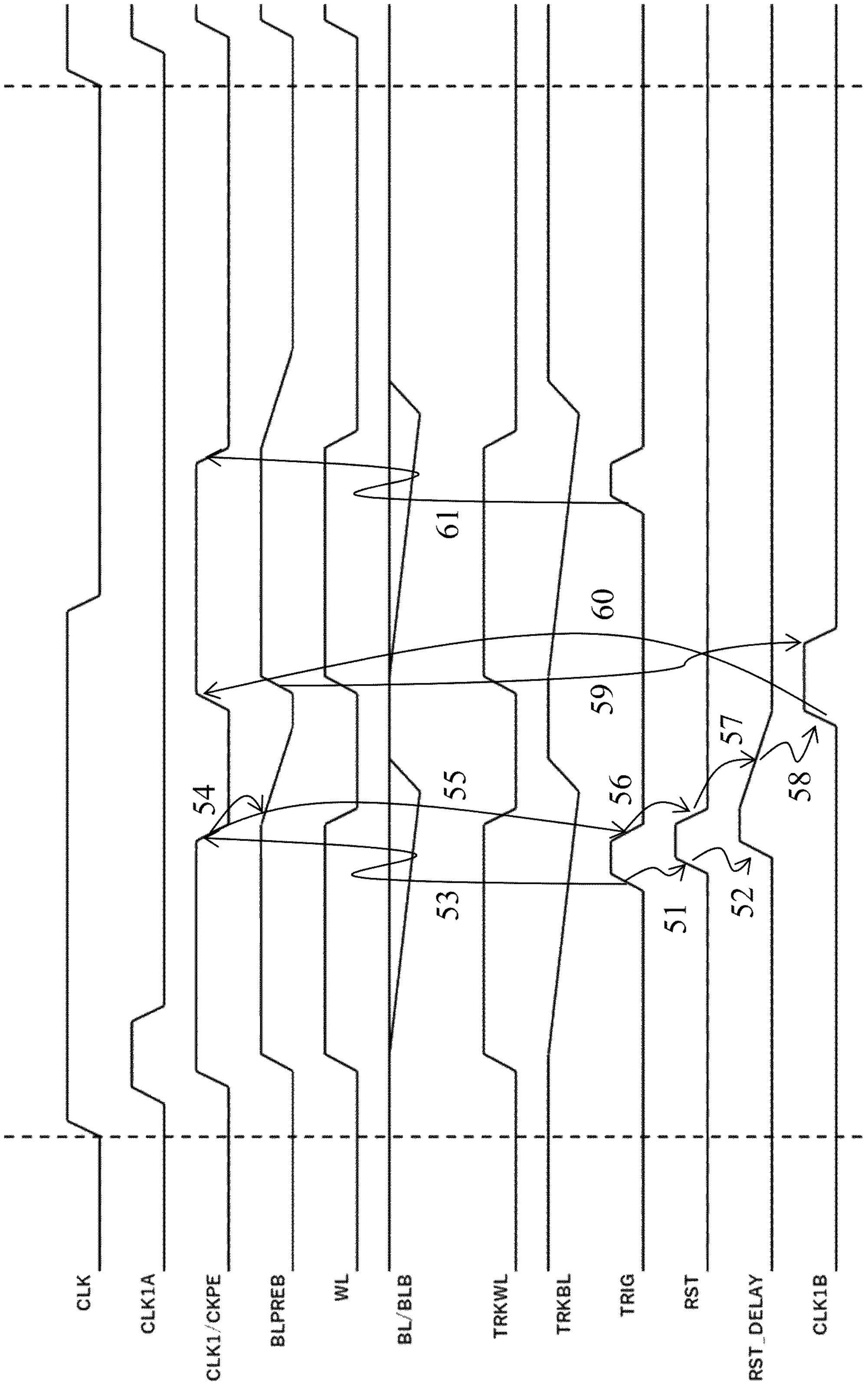
FIG. 5 is a waveform diagram illustrating various signals within the memory device in accordance with the embodiment of FIG. 4C.

FIG. 5 is a waveform diagram illustrating various signals within the memory device in accordance with the embodiment of FIG. 4C.

In some embodiments, the operations of the memory device 100E may be similar to those of the memory device 100A, and thus operations of the memory device 100E are described with reference to arrows 51 to 61 shown in FIG. 5 as follows.

In some embodiments, upon the voltage level of the tracking word line TRKBL shown in FIG. 4C decreases to a certain voltage level (e.g., logic 0), the trigger signal TRIG is switched from the low logic state to the high logic state, indicating that the first memory access operation is completed. The trigger signal TRIG is delayed by a buffer to generate the reset signal RST, as shown by arrow 51. Upon the control logic 105 detecting the rising edge of the trigger signal TRIG, the control logic 105 de-asserts the internal clock signal CLK1/CKPE, as shown by arrow 53. In addition, the delayed reset signal RST_DELAY is generated from the reset signal RST through the conductive wires 147-148 and buffer 144, as shown by arrow 52. Upon the control logic 105 detecting the falling edge of the internal clock signal CLK1/CKPE, the control logic 105 asserts the bit-line precharge signal BLPREB (e.g., decreases the voltage of BLPREB) and de-asserts the trigger signal TRIG, as shown by arrows 54 and 55, respectively. It should be noted that the rising slew rate of the delayed reset signal RST_DELAY is small due to the large RC loading of the conductive wires 147 and 148, such that the voltage of the bit-line precharge signal BLPREB decreases gradually. Following the trigger signal TRIG, the reset signal RST is also de-asserted, as shown by arrow 56. Similarly, the decreasing slew rate of the delayed reset signal RST_DELAY is relatively small due to the large RC loading of the conductive wires 147 and 148. In some embodiments, the clock generator 12 generates the switch control signal PS based on the delay reset signal RST_DELAY, as shown in FIG. 4C. Specifically, upon detecting the falling edge of the delayed reset signal RST_DELAY, the clock generator 12 switches the switch control signal PS from the low logic state (e.g., "0") to the high logic state ("1"), allowing the multiplexers 19A, 19B, and 16 to select the decoded row address signal XAB, the decoded column address signal YAB, and the write enable signal WEB for the second memory access operation associated with Port-B. Additionally, the multiplexers 13 and 15 also selects the input data signal DB and output data signal QB, respectively.

In some embodiments, when the clock generator 12 detects the falling edge of the delayed reset signal RST_DELAY, the clock generator 12 generates a clock pulse of an internal clock signal CLK1B, as shown by arrow 58. It should be noted that the clock pulse of the internal clock signal CLK1B is maintained at the high logic state until the bit-line precharge signal BLPREB is pulled down to the ground voltage (e.g., OV) at the edge portion 146 and the bit line pairs BL/BLB are fully pre-charged (i.e., detecting the rising edge of BLPREB) to the predetermined voltage level (e.g., VDD/2), as shown by arrow 59. Furthermore, the internal clock signal CLK1 is generated by OR gate 14 using the internal clock signals CLK1A and CLK1B from the clock generators 11 and 12. When the clock pulse of the internal clock signal CLK1B is generated, the internal clock signal CLK1 generated by OR gate 14 follows the clock pulse of the internal clock signal CLK1B with one OR-gate delay, as shown by arrow 60. Additionally, the second clock pulse of the internal clock signal CLK1/CKPE is pulled down to the ground voltage (e.g., logic 0) when the control logic 105 detects another rising edge of the trigger signal TRIG, as shown by arrow 61.

Figure 6A:
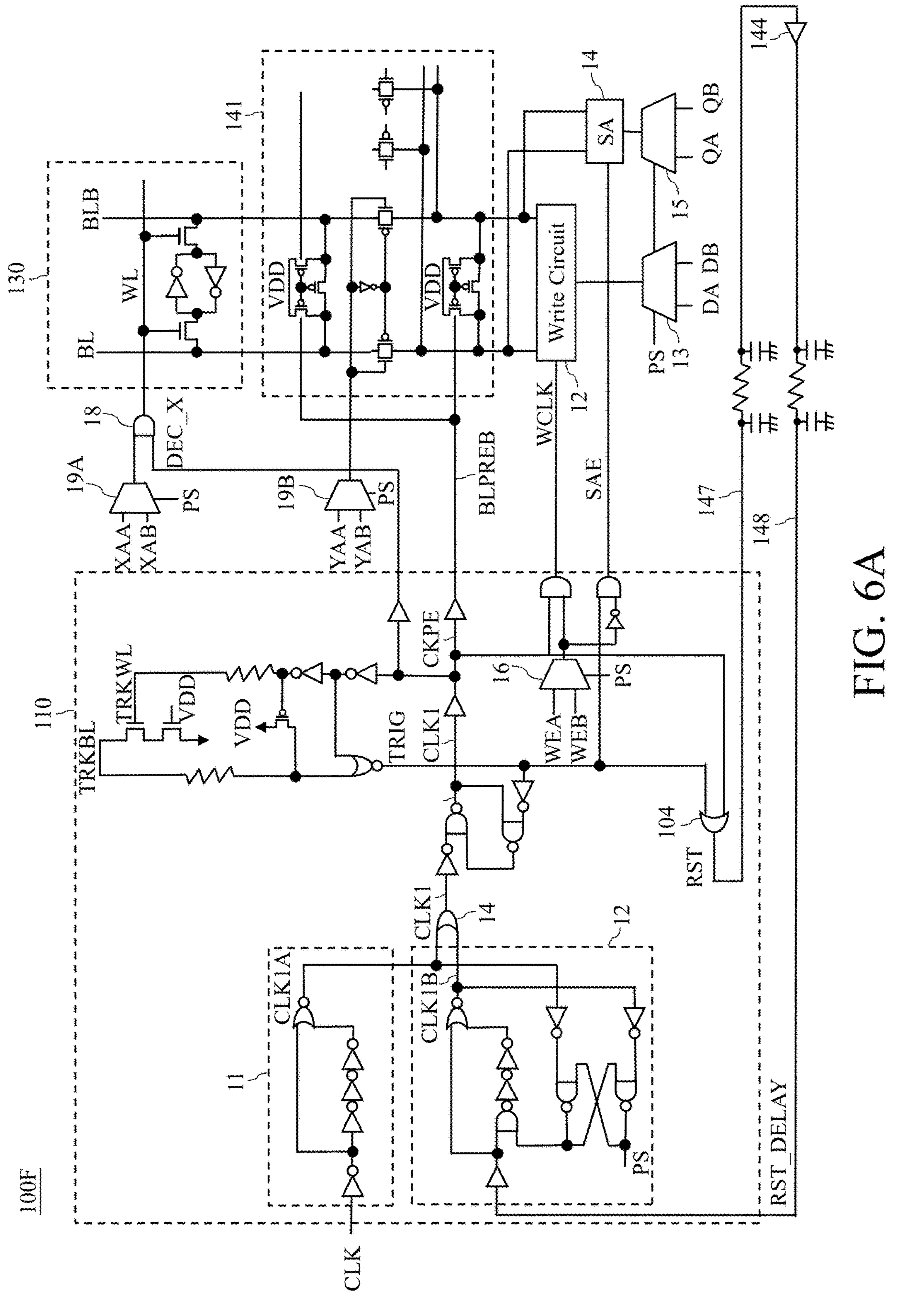
FIG. 6A is a schematic diagram of a memory device in accordance with some embodiments of the present disclosure.
Figure 6B:
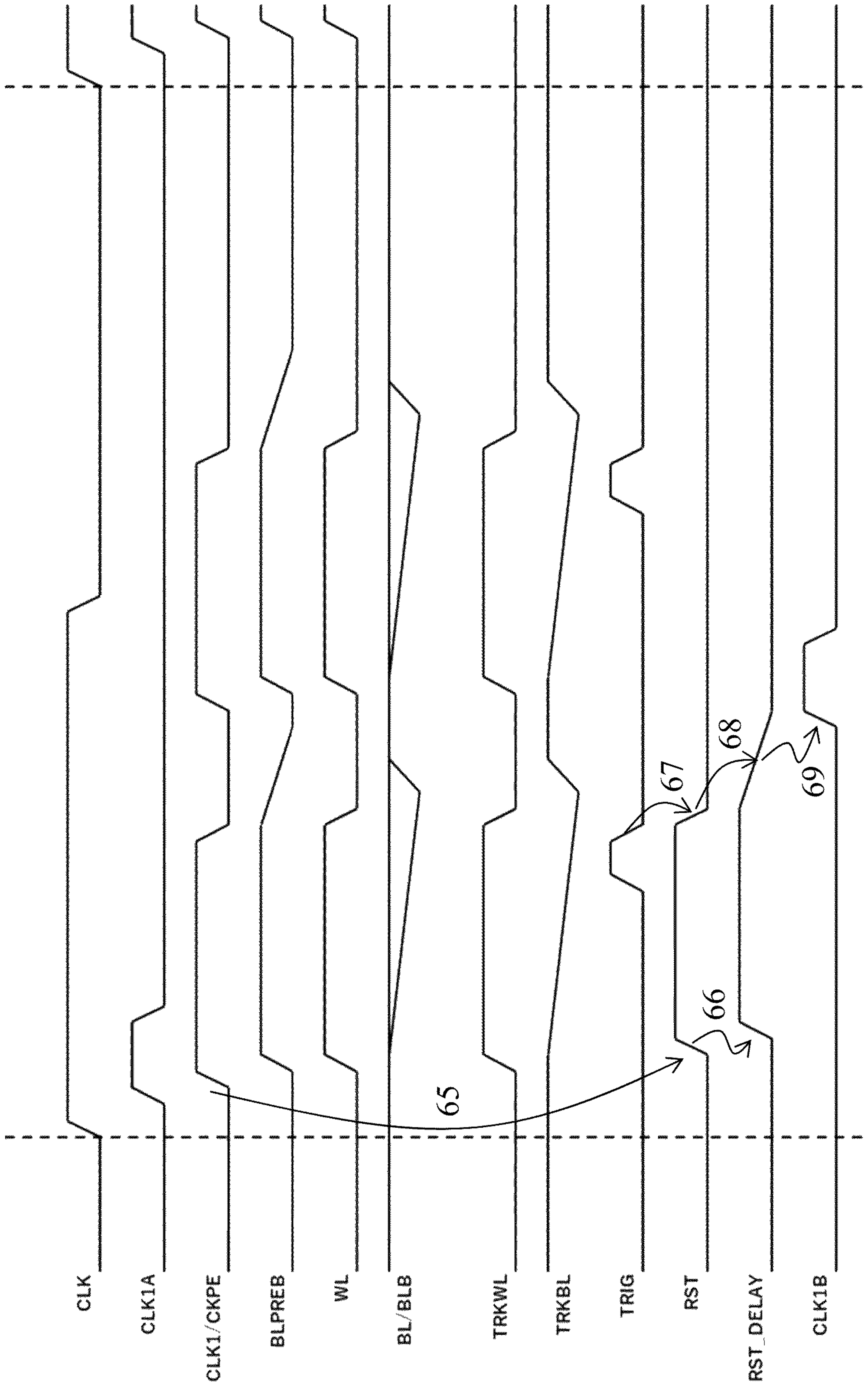
FIG. 6B is a waveform diagram illustrating various signals within the memory device in FIG. 6A.

FIG. 6A is a schematic diagram of a memory device in accordance with some embodiments of the present disclosure. FIG. 6B is a waveform diagram illustrating various signals within the memory device in FIG. 6A.

In some embodiments, the memory device 100F shown in FIG. 6A may be similar to the memory device 100E shown in FIG. 5C, with the difference being that the reset signal RST is generated by an OR gate 104 using the trigger signal TRIG and the internal clock signal CKPE, and thus operations of the memory device 100F are described with reference to arrows 65 to 69 shown in FIG. 5 as follows.

For example, when the first clock pulse of the internal clock CLK1/CKPE is generated, the reset signal RST follows the internal clock CLK1/CKPE with an OR-gate delay, as shown by arrow 65. The delayed reset signal RST_DELAY is generated from the reset signal RST through the conductive wires 147-148 and buffer 144, as shown by arrow 66. Upon the control logic 105 detecting the falling edge of the internal clock signal CLK1/CKPE, the control logic 105 asserts the bit-line precharge signal BLPREB (e.g., decreases the voltage of BLPREB) and de-asserts the trigger signal TRIG, as described above. It should be noted that the rising slew rate of the delayed reset signal RST_DELAY is small due to the large RC loading of the conductive wires 147 and 148, such that the voltage of the bit-line precharge signal BLPREB decreases gradually. Following the trigger signal TRIG, the reset signal RST is also de-asserted, as shown by arrow 67. Similarly, the decreasing slew rate of the delayed reset signal RST_DELAY is relatively small due to the large RC loading of the conductive wires 147 and 148. Upon detecting the falling edge of the delayed reset signal RST_DELAY, the clock generator 12 switches the switch control signal PS from the low logic state (e.g., "0") to the high logic state ("1"), allowing the multiplexers 19A, 19B, and 16 to select the decoded row address signal XAB, the decoded column address signal YAB, and the write enable signal WEB for the second memory access operation associated with Port-B. Additionally, the multiplexers 13 and 15 also selects the input data signal DB and output data signal QB, respectively. The remaining operations of the memory device 100F are similar to those of the memory device 100E described in the embodiments of FIG. 5, and the details thereof are not repeated here.

Figure 7A:
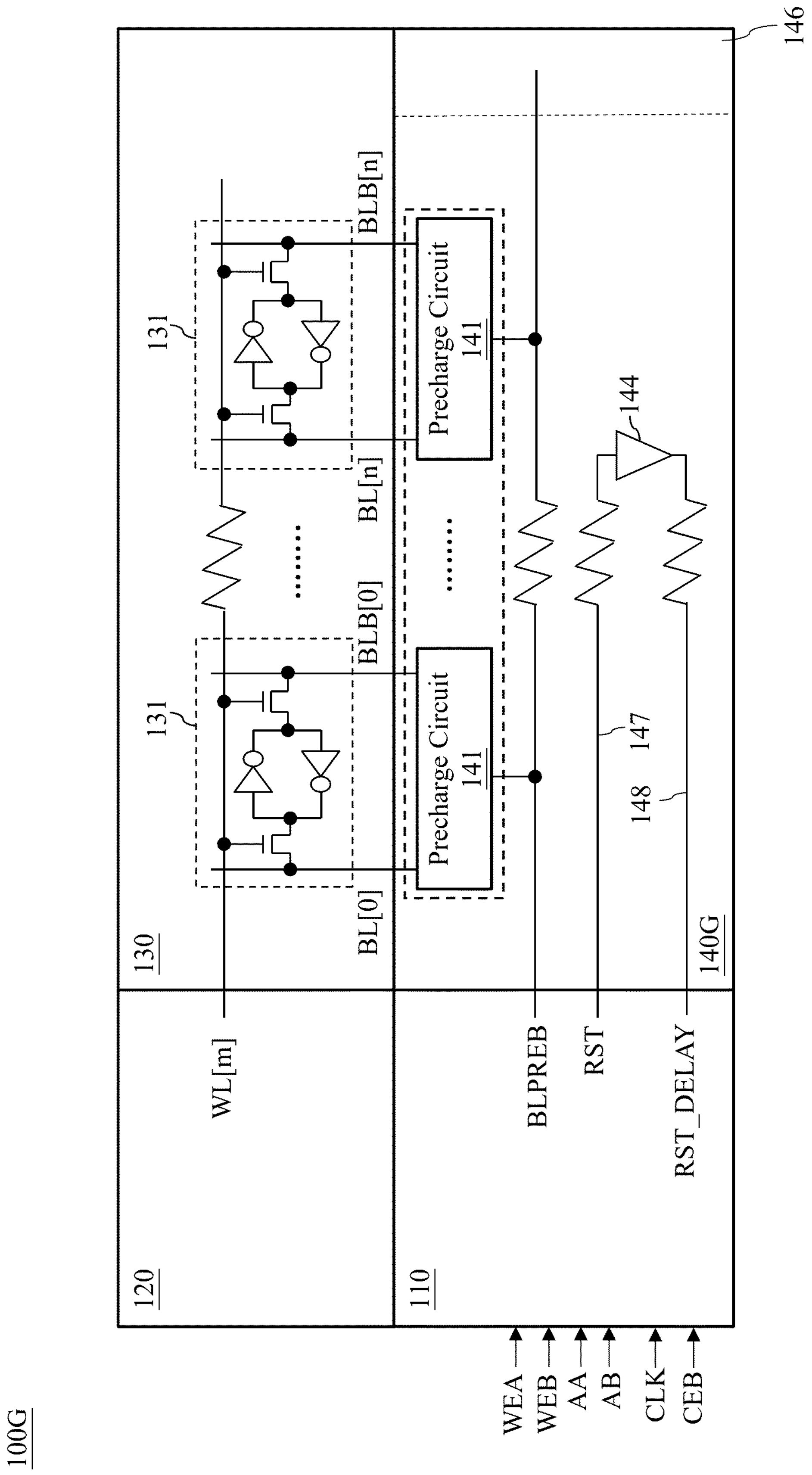
FIG. 7A is a block diagram of a memory device in accordance with some embodiments of the present disclosure.

FIG. 7A is a block diagram of a memory device in accordance with some embodiments of the present disclosure.

In some embodiments, the memory device 100G shown in FIG. 7A is similar to the memory device 100E shown in FIG. 4A, with the difference being that the routing path of the conductive wires 147 and 148 is returned at the middle portion of the data I/O circuit 140G through buffer 144 rather than at the edge portion 146 in the memory device 100G. It should be noted that the returning location of the conductive wires 147 and 148 can be at any location within the data I/O circuit 140G, depending on the RC loading required to create an appropriate delay for the delayed reset signal RST_DELAY to ensure the time margin between completion of the first memory access operation and the execution of the second memory access operation.

Figure 7B:
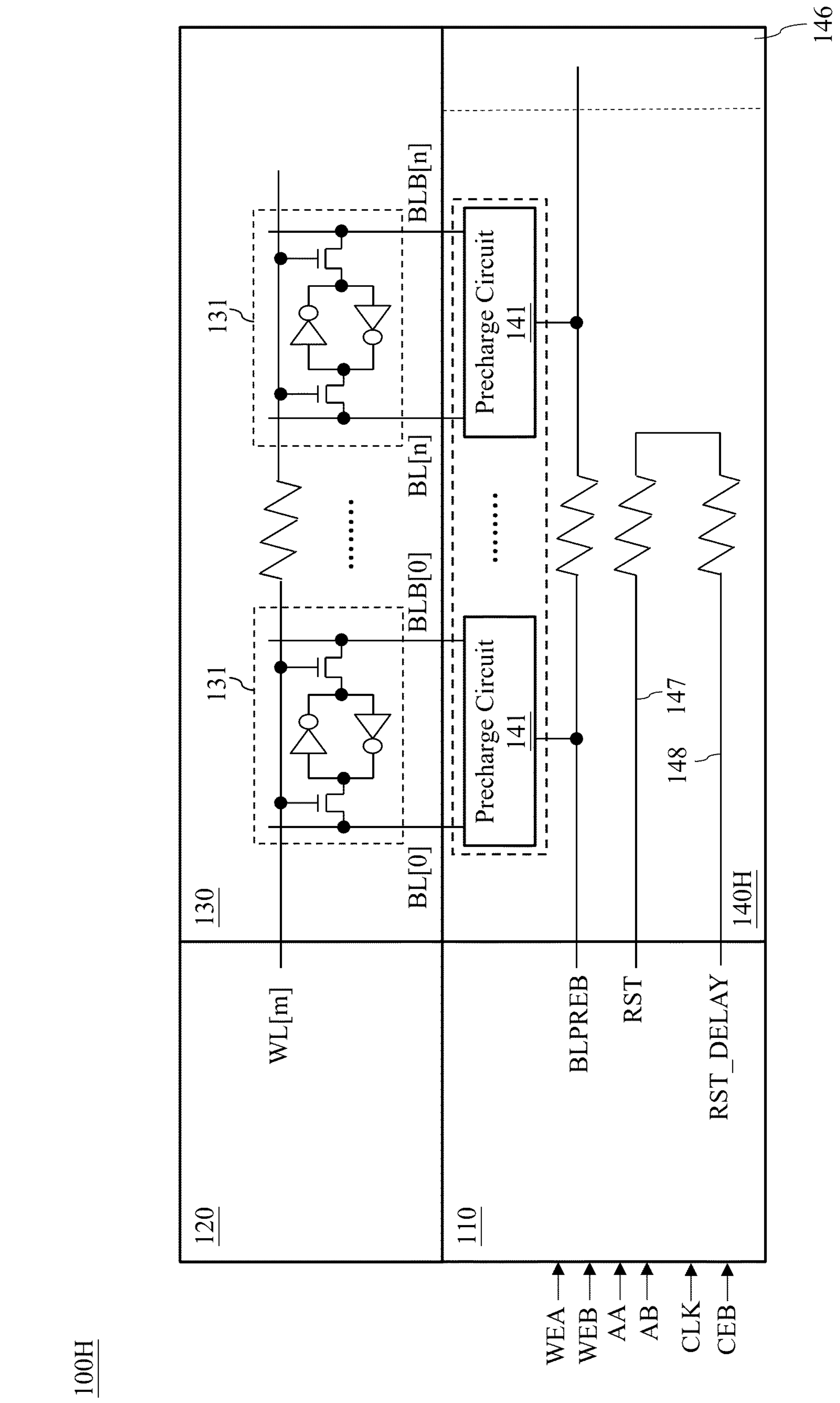
FIG. 7B is a block diagram of a memory device in accordance with some embodiments of the present disclosure.

FIG. 7B is a block diagram of a memory device in accordance with some embodiments of the present disclosure.

In some embodiments, the memory device 100H shown in FIG. 7B is similar to the memory device 100G shown in FIG. 7A, with the difference being that the buffer 144 is omitted from the memory device 100G. Specifically, buffer 144 is replaced by yet another segment of the conductive wires 147 and 148 at the returning position. It should be noted that buffer 144 shown in FIG. 7A may be designed to add some delay to the delayed reset signal RST_DELAY, and thus can be omitted with the RC loading of the conductive wires 147 and 148 being large enough to create an appropriate delay to the delayed reset signal RST_DELAY.

Figure 8:
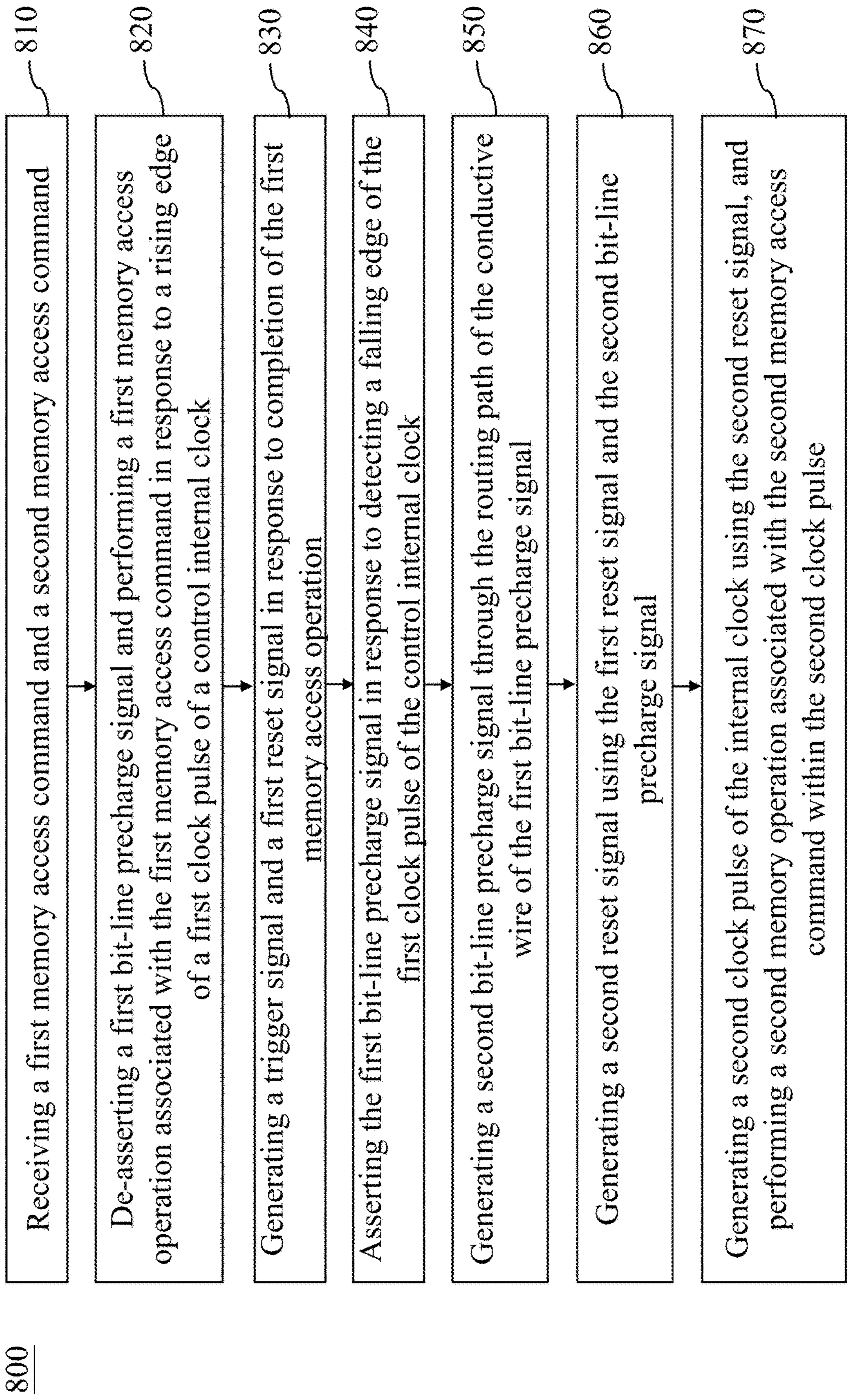
FIG. 8 is a flowchart of a method for method for maintaining time margin between consecutive memory access operations of a memory device in accordance with an embodiment of the present disclosure.

FIG. 8 is a flowchart of a method for method for maintaining time margin between consecutive memory access operations of a memory device in accordance with an embodiment of the present disclosure. Please refer to FIGS. 1A-1C and FIG. 8.

In operation 810, a memory control circuit 110 is utilized to receive a first memory access command and a second memory access command. For example, each of the first memory access command and the second memory access command may be a memory read command or a memory write command.

In operation 820, the memory control circuit 110 de-asserts a first bit-line precharge signal BLPREB and performs a first memory access operation associated with the first memory access command in response to a rising edge of a first clock pulse of a control internal clock CLK1/CKPE, wherein the internal clock CLK/CKPE is derived from a first clock signal CLK1A generated by a first clock generator 11 and a second clock signal CLK1B generated by a second clock generator 12. Additionally, a routing path of the first bit-line precharge signal BLPREB extends from the memory control circuit 110 to an edge portion 146 of a data I/O circuit 140A, and returns back from the edge portion to the memory control circuit 110. It should be noted that the memory control circuit 110 and the edge portion 146 may be disposed on opposite sides of the data I/O circuit 140A.

In operation 830, the memory control circuit 110 generates a trigger signal TRIG and a first reset signal RST in response to completion of the first memory access operation. In some embodiments, when the voltage of the tracking bit line decreases to a certain voltage level indicating the low logic state (e.g., logic 0), the trigger signal TRIG is asserted to indicate completion of the first memory access operation. When the memory control circuit 110 detects a rising edge of the trigger signal TRIG, the memory control circuit 110 pulls down the internal clock CLK1/CKPE from the high logic state to the low logic state.

In operation 840, the memory control circuit 110 asserts the first bit-line precharge signal BLPREB in response to detecting a falling edge of the first clock pulse of the control internal clock CLK1/CKPE.

In operation 850, a second bit-line precharge signal BLPREB_RET is generated through the routing path of the conductive wire of the first bit-line precharge signal BLPREB.

In operation 860, a second reset signal RST_DELAY is generated using the first reset signal RST and the second bit-line precharge signal BLPREB_RET.

In operation 870, the second clock generator 12 generates a second clock pulse of the internal clock CLK1/CKPE using the second reset signal RST_DELAY, and the memory control circuit 110 performs a second memory operation associated with the second memory access command within the second clock pulse. In some embodiments, the time margin between the falling edge of the first clock pulse and the rising edge of the second clock pulse is increased using the second reset signal RST_DELAY which is generated by the OR gate 102 using the first reset signal and the second bit-line precharge signal BLPREB_RET. Therefore, the increase time margin can ensure that the bit line pairs BL/BLB of the memory cells 131 are precharged to the predetermined voltage level (e.g., VDD/2) before performing the second memory access operation associated with the second memory access command, thereby improving the reliability of the memory device 100A.

An aspect of the present disclosure provides a memory device, which includes a first memory array, and a memory control circuit. The first memory array includes a plurality of first memory cells arranged in a two-dimensional array having a plurality of first word lines and a plurality of first bit lines. The memory control circuit is configured to receive a first memory access command and a second memory access command. The memory control circuit is configured to perform a first memory access operation associated with the first memory access command in response to a first clock pulse of a control internal clock signal generated from a first internal clock signal and a second internal clock signal. The memory control circuit is configured to generate a first reset signal and assert a first bit-line precharge signal in response to completion of the first memory access operation, and generate a second reset signal using the first reset signal and a second bit-line precharge signal obtained from the first bit-line precharge signal. The memory control circuit is configured to generate a second clock pulse of the control internal clock signal in response to the second reset signal, and perform a second memory access operation associated with the second memory access command within the second clock pulse.

Another aspect of the present disclosure provides a memory device, which includes a first memory array, and a memory control circuit. The first memory array includes a plurality of first memory cells arranged in a two-dimensional array having a plurality of first word lines and a plurality of first bit lines. The memory control circuit is configured to receive a first memory access command and a second memory access command. The memory control circuit is configured to perform a first memory access operation associated with the first memory access command in response to a first clock pulse of a control internal clock signal generated from a first internal clock signal and a second internal clock signal. The memory control circuit is configured to generate a first reset signal and assert a first bit-line precharge signal in response to completion of the first memory access operation, and generate a second reset signal using the first reset signal. The memory control circuit is configured to generate a second clock pulse of the control internal clock signal in response to the second reset signal, and perform a second memory access operation associated with the second memory access command within the second clock pulse.

Yet another aspect of the present disclosure provides a method, which includes a method for maintaining a time margin between consecutive memory access operations, for use in a memory device. The memory device includes a memory array and a memory control circuit. The method includes the following steps: utilizing the memory control circuit to receive a first memory access command and a second memory access command; utilizing the memory control circuit to perform a first memory operation associated with the first memory access command; utilizing the memory control circuit to generate a first reset signal and in response to completion of the first memory access command; utilizing the memory control circuit to assert a first bit-line precharge signal in response to detecting a falling edge of a first clock pulse of a control internal clock; utilizing the memory control circuit to generate a second reset signal using the first reset signal and a second bit-line precharge signal obtained through a routing path of a conductive wire of the first bit-line precharge signal; and utilizing the memory control circuit to generate a second clock pulse of the control internal clock using the second reset signal and to perform a second memory access operation associated with the second memory command.

The methods and features of the present disclosure have been sufficiently described in the provided examples and descriptions. It should be understood that any modifications or changes without departing from the spirit of the present disclosure are intended to be covered in the protection scope of the present disclosure.

Moreover, the scope of the present application is not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, can be utilized according to the present disclosure.

Accordingly, the appended claims are intended to include within their scope: processes, machines, manufacture, compositions of matter, means, methods or steps. In addition, each claim constitutes a separate embodiment, and the combination of various claims and embodiments are within the scope of the present disclosure.

What is claimed is:

1. A memory device, comprising:

a first memory array, comprising a plurality of first memory cells, arranged in a two-dimensional array having a plurality of first word lines and a plurality of first bit lines; and a memory control circuit, configured to control the first memory array and receive a first memory access command and a second memory access command;

wherein the memory control circuit is configured to perform a first memory access operation associated with the first memory access command in response to a first clock pulse of a control internal clock signal generated from a first internal clock signal and a second internal clock signal, wherein the memory control circuit is configured to generate a first reset signal and assert a first bit-line precharge signal in response to completion of the first memory access operation, and generate a second reset signal using the first reset signal and a second bit-line precharge signal obtained from the first bit-line precharge signal, wherein the memory control circuit is configured to generate a second clock pulse of the control internal clock signal in response to the second reset signal, and perform a second memory access operation associated with the second memory access command within the second clock pulse, wherein the memory control circuit is further configured to perform an OR operation on a trigger signal and the control internal clock signal to generate the first reset signal.

2. The memory device of claim 1, wherein the memory control circuit is configured to receive an input clock signal and generate the first internal clock signal using the input clock signal.

3. The memory device of claim 2, wherein the memory control circuit is configured to generate the second internal clock signal and a switch control signal using the second reset signal.

4. The memory device of claim 3, wherein the memory control circuit uses a first address signal and a first write enable signal indicated by the first memory access command to perform the first memory access operation in response to the switch control signal being in a first logic state.

5. The memory device of claim 4, wherein a routing path of a conductive wire of the first bit-line precharge signal extends from the memory control circuit to an edge portion of a data input/output circuit of the memory device, and returns from the edge portion to the memory control circuit to generate the second bit-line precharge signal.

6. The memory device of claim 5, wherein the memory control circuit and the edge portion are disposed at opposite sides of the data input/output circuit.

7. The memory device of claim 5, wherein the routing path is through a buffer disposed at the edge portion.

8. The memory device of claim 4, wherein a routing path of a conductive wire of the first bit-line precharge signal extends from the memory control circuit to a middle portion of a data input/output circuit, and returns from the middle portion to the memory control circuit to generate the second bit-line precharge signal.

9. The memory device of claim 8, wherein the routing path is through a buffer disposed at the middle portion.

10. The memory device of claim 4, wherein the memory control circuit switches the switch control signal to a second logic state different from the first logic state in response to detecting a falling edge of the second reset signal.

11. The memory device of claim 10, wherein the memory control circuit uses a second address signal and a second write enable signal indicated by the second memory access command to perform the second memory access operation in response to the switch control signal being in the second logic state.

12. The memory device of claim 11, further comprising:

a second memory array, comprising a plurality of second memory cells, arranged in a two-dimensional array having a plurality of second word lines and a plurality of second bit lines; and a word line driving circuit, configured to assert one of the first word lines or the second word lines according to the first address signal or the second address signal, wherein the first memory array and the second memory array are disposed at opposite sides of the word line driving circuit.

13. The memory device of claim 12, further comprising: a first data input/output circuit and a second data input/output circuit disposed at opposite sides of the memory control circuit, wherein:

the memory control circuit is configured to generate a third bit-line precharge signal for precharging the second bit lines associated with the second memory cells within the second memory array;

a first routing path of a first conductive wire of the first bit-line precharge signal extends from the memory control circuit to a first edge portion of the first data input/output circuit, and returns from the first edge portion to the memory control circuit to generate the second bit-line precharge signal; and a second routing path of a second conductive wire of a third bit-line precharge signal extends from the memory control circuit to a second edge portion of the second data input/output circuit, and returns from the second edge portion to the memory control circuit to generate a fourth bit-line precharge signal.

14. The memory device of claim 13, wherein the memory control circuit performs an OR operation on the second bit-line precharge signal, the fourth bit-line precharge signal, and the first reset signal to generate the second reset signal.

15. A memory device, comprising:

a memory array, comprising a plurality of memory cells, arranged in a two-dimensional array having a plurality of word lines and a plurality of bit lines; and a memory control circuit, configured to control the memory array and receive a first memory access command and a second memory access command;

wherein the memory control circuit is configured to perform a first memory access operation associated with the first memory access command in response to a first clock pulse of a control internal clock signal generated from a first internal clock signal and a second internal clock signal, wherein the memory control circuit is configured to generate a first reset signal and assert a first bit-line precharge signal in response to completion of the first memory access operation, and generate a second reset signal using the first reset signal, wherein the memory control circuit is configured to generate a second clock pulse of the control internal clock signal in response to the second reset signal, and perform a second memory access operation associated with the second memory access command within the second clock pulse, wherein the memory control circuit is further configured to perform an OR operation on a trigger signal and the control internal clock signal to generate the first reset signal.

16. The memory device of claim 15, wherein a routing path of a conductive wire of the first reset signal extends from the memory control circuit to an edge portion of a data input/output circuit of the memory device, and returns from the edge portion to the memory control circuit to generate the second bit-line precharge signal.

17. A method for maintaining a time margin between consecutive memory access operations, for use in a memory device, wherein the memory device comprises a memory array and a memory control circuit, the method comprising:

utilizing the memory control circuit to receive a first memory access command and a second memory access command;

utilizing the memory control circuit to perform a first memory access operation associated with the first memory access command;

utilizing the memory control circuit to generate a first reset signal in response to completion of the first memory access command;

utilizing the memory control circuit to assert a first bit-line precharge signal in response to detecting a falling edge of a first clock pulse of a control internal clock;

utilizing the memory control circuit to generate a second reset signal using the first reset signal and a second bit-line precharge signal obtained through a routing path of a conductive wire of the first bit-line precharge signal; and utilizing the memory control circuit to generate a second clock pulse of the control internal clock using the second reset signal and to perform a second memory access operation associated with the second memory access command, wherein the routing path of the conductive wire of the first bit-line precharge signal extends from the memory control circuit to an edge portion of a data input/output circuit and returns from the edge portion to the memory control circuit.

18. The method of claim 17, further comprising: utilizing the memory control circuit to alternate a logic state of a switch control signal using the second reset signal to switch from the first memory access operation to the second memory access operation.

19. The memory device of claim 16, wherein the memory control circuit and the edge portion are disposed at opposite sides of the data input/output circuit.

20. The method of claim 17, wherein the memory control circuit and the edge portion are disposed at opposite sides of the data input/output circuit.

* * * * *